United States Patent [19]

Sakao et al.

[11] Patent Number: 5,698,467
[45] Date of Patent: Dec. 16, 1997

[54] METHOD OF MANUFACTURING AN INSULATION LAYER HAVING A FLAT SURFACE

[75] Inventors: Masato Sakao; Yoshihiro Takaishi, both of Tokyo, Japan

[73] Assignee: NEC Corporation, Tokyo, Japan

[21] Appl. No.: 742,811

[22] Filed: Nov. 1, 1996

[30] Foreign Application Priority Data

Nov. 10, 1995 [JP] Japan .................................. 7-293088

[51] Int. Cl.⁶ .................................................. H01L 21/316
[52] U.S. Cl. .......................... 437/195; 437/228; 437/235; 437/238; 156/628.1; 156/636.1; 156/662.1
[58] Field of Search .............................. 437/195, 228, 437/235, 238; 156/636.1, 662.1, 628.1

[56] References Cited

U.S. PATENT DOCUMENTS

| 5,244,841 | 9/1993 | Marks et al. | 437/228 |
| 5,302,233 | 4/1994 | Kim et al. | 156/636.1 |
| 5,494,854 | 2/1996 | Jain | 437/228 |

FOREIGN PATENT DOCUMENTS

| 5109911 | 4/1993 | Japan . |
| 758104 | 3/1995 | Japan . |

*Primary Examiner*—Charles L. Bowers, Jr.
*Assistant Examiner*—Matthew Whipple
*Attorney, Agent, or Firm*—Whitham, Curtis, Whitham & McGinn

[57] ABSTRACT

In a method of manufacturing an insulation layer on a semiconductor substrate, a first insulation film is deposited on the semiconductor substrate more thicker than a wiring layer formed on the semiconductor substrate. The first insulation film is mechano-chemically polished to expose a void formed in the first insulation film. The first insulation film is etched to widen an entrance portion of the void. A second insulation film is formed on the first insulation film to be embedded into the void. The second insulation film is etched at least to the first insulation film, with a part of the second insulation film left within the void. The exposed first insulation film and the left second insulation film has a flat surface.

7 Claims, 6 Drawing Sheets

METHOD OF MANUFACTURING AN INSULATION LAYER HAVING A FLAT SURFACE

BACKGROUND OF THE INVENTION

This invention relates to a method of manufacturing an insulation layer having a flat surface on a semiconductor substrate which has a wiring structure on its surface.

Recently, multi-layer wires which have a plurality of wiring layers are utilized in a semiconductor integrated circuit. Each of the wiring layers has a plurality of wires and is insulated from adjoining wiring layers by insulation layers. It is preferable that each insulation layer has a flat or even surface so that the wiring layer is precisely formed on the insulation layer.

Generally, it is known in the art that an SOG (spin on glass) etch back method provides a flat surface on an insulation layer. In the SOG etch back method, a first CVD (chemical vapor deposition) film is at first deposited on a semiconductor substrate which has a wiring structure (or layer) on its surface. An SOG film is thereafter formed on the first CVD film.

The SOG film is etched back together with a part of the first CVD film to obtain a flat surface formed by an exposed surface of the first CVD film and parts of the SOG film which is partially within the first CVD film. A second CVD film is formed on the flat surface and is also flat.

As mentioned above, the SOG etch back method can provide the flat surface of the insulation layer. However, the SOG etch back method is not suitable for flattening a wide area, such as the whole area of an IC chip.

As a technique for providing a wide flat surface of an insulation layer, recent attention has been given to a CMP (mechanochemical polishing) method. In the CMP method, an insulation film is deposited on a semiconductor substrate which has a wiring structure (or layer) on its surface. The insulation film is mechano-chemically polished so as to flatten its surface. Therefore, the insulation film has a flat surface of a wide area.

However, there is a case that an undesigned void or groove is exposed on the surface of the insulation film by the polishing in the CMP method. It often happens that the void might be formed at a space between wires of the wiring layer within the insulation film when the space is narrow and each of the wires is high, namely when the space has high aspect ratio.

In a conventional method for solving the problems as mentioned above, a first insulation film is deposited and polished like the above mentioned CMP method. A second insulation film, such as $O_3$-TEOS (ozon-tetra ethyl oxide silicon) film, is deposited on the first insulation film. In this event, a groove which is exposed on the first insulation film is embedded by the second insulation film. However, the second insulation film can not always completely cover the groove when the groove has an entrance portion which is very small in width. Namely, the conventional method can not always embed or cover all voids formed within the first insulation film.

In another conventional method, an insulation film is deposited on a semiconductor substrate which has a wiring layer on its surface. The insulation film has a notch at a space between wires of the wiring layer. The insulation film is partly etched back to widen the notch. An SOG film is formed on the insulation film to be embedded into the notch. However, the SOG film objectionably remains above the whole surface of the semiconductor substrate and is injurious at a later process.

SUMMARY OF THE INVENTION

It is therefore an object of this invention to provide a method of manufacturing an insulation layer which has an even surface.

It is another object of this invention to provide a method manufacturing an insulation layer which has no void within its inside.

It is still another object of this invention to provide a method of manufacturing an insulation layer which has minimum SOG film.

Other objects of this invention will become clear as the description proceeds.

According to an aspect of this invention, a method is for use in manufacturing an insulation layer having a flat surface on a semiconductor substrate to cover a wiring structure which is formed on the semiconductor substrate and which has a plurality of separated sections having a first thickness. The method comprises the steps of depositing a first insulation film on the semiconductor substrate so that the first insulation film has a second thickness which is thicker than the first thickness, the first insulation film including an undesigned void which is formed at a space between the separated sections of the wiring structure, polishing the first insulation film to expose a void formed at a space between the separated sections of the wiring structure and to change the void into a groove which has an entrance portion, etching the first insulation film to widen the entrance portion, forming a second insulation film on the first insulation film to be embedded into the groove, and etching the second insulation film at least to said first insulation film to form the flat surface, with a part of the second insulation film left within the groove.

DESCRIPTION OF THE PREFERRED EMBODIMENT

Referring to FIGS. 1A through 1G, description will be at first directed to a first conventional method of manufacturing an insulation layer for a better understanding of this invention.

The illustrated conventional method is similar to that disclosed in Japanese Patent Prepublication No. 58104/1995.

Figure 1A:
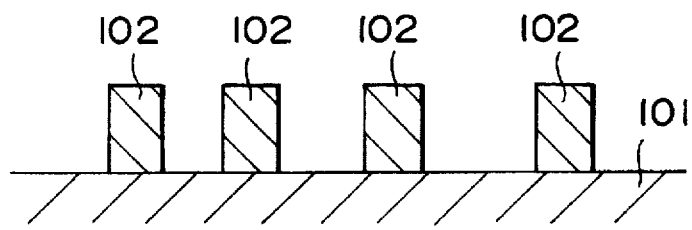
FIGS. 1A through 1D show sectional views for use in describing steps of a first conventional method.

At first, a semiconductor substrate 101 is prepared which have a plurality of semiconductor devices (not shown)

therein. In FIG. 1A, the semiconductor substrate 101 has a surface on which a wiring structure is formed. The wiring structure has a plurality of wires or patterns 102 each of which has a first thickness and which is connected to nodes or pads (not shown) of the semiconductor devices.

Figure 1B:
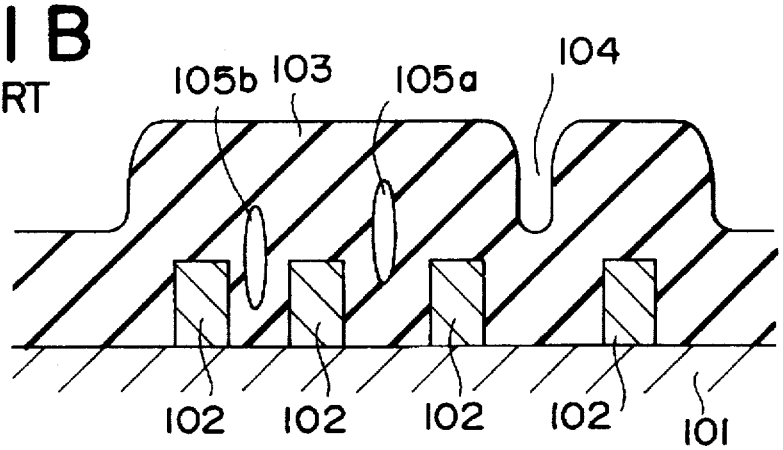

Next, a first insulation film 103 is deposited on the semiconductor substrate 101 to cover the wires 102. The first insulation film 103 has a second thickness which is thicker than the first thickness. At this time, if a space between the wires 102 is wide enough in comparison with the first thickness, the space is completely embedded by the first insulation film 103 and a slit or a valley 104 is formed above the space at surface of the first insulation film 103 as shown in FIG. 1B.

On the other hand, if the space is not wide enough in comparison with the first thickness, a first undesigned or undesired void 105a is formed at the space near the surface of the first insulation film 103. Moreover, if the space is comparative by narrow, a second undesigned void 105b is formed at the space and is close to the surface of the semiconductor substrate 101 as compared with the first undesigned void 105a.

Figure 1C:
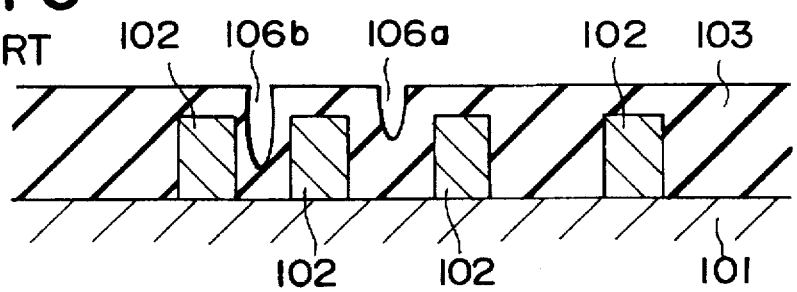

The first insulation film 103 is mechanochemically polished to remove the notch 104 and to expose the voids 105a and 105b and to change the first and the second voids 105a and 105b into first and second channels or grooves 106a and 106b as shown in FIG. 1C.

Figure 1D:
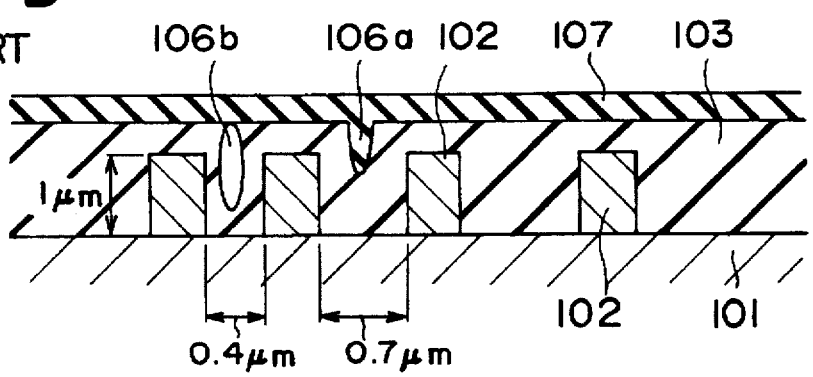

A second insulation film 107, such as $O_3$-TEOS (ozontetra ethyl oxide silicon) film, is deposited on the first insulation film 103 as shown in FIG. 1D. In this event, the first groove 106a will be embedded with the second insulation film 107. However, the second groove 106b is not embedded with the second insulation film 107. This is because the second groove 106b has an entrance portion which is narrower in width than its inside portion as illustrated in FIG. 1D. Moreover, the inside portion of the groove 106b is also narrower in width than an inside portion of the void 105a because each inside widths of the inside portions is proportional to a width of each of the spaces. For example, it has been confined that, when each space between the wires 102 has a width of 0.7 μm and a height of 1 μm, the first groove 106a is embedded with the second insulation film 107. On the other hand, when the space between wires 102 is reduced to 0.4 μm in width with the height of 1 μm kept unchanged, it has been formed out that the second groove 106b is not completely embedded with the second insulation film 107.

The second void 106b have often burst and generate particles of the first and the second insulation film 103 and 107 in a later vacuum process. The particles are injurious to an end product.

Referring to FIGS. 2A through 2D, description will be made about a second conventional method of manufacturing an insulation layer. The illustrated conventional method is similar to that disclosed in Japanese Patent Prepublication No. 109911/1993.

Figure 2A:
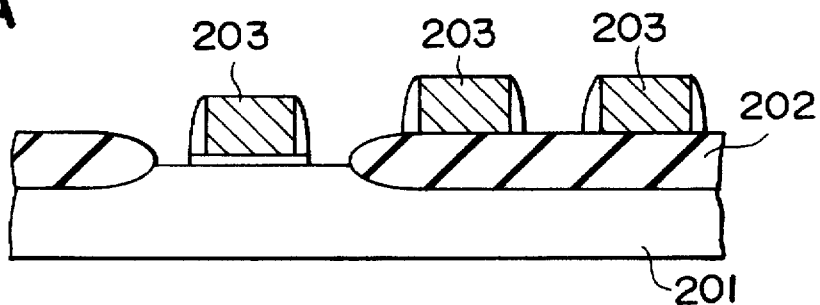
FIGS. 2A through 2D show sectional views for use in describing steps of a second conventional method.

At first, a semiconductor substrate 201 is prepared which has semiconductor devices (not shown) within its inside and has a device isolation layer 202 on its surface. Polycrystalline silicon wires are formed on the semiconductor substrate 201 and the device isolation layer 202 as shown in FIG. 2A.

Figure 2B:
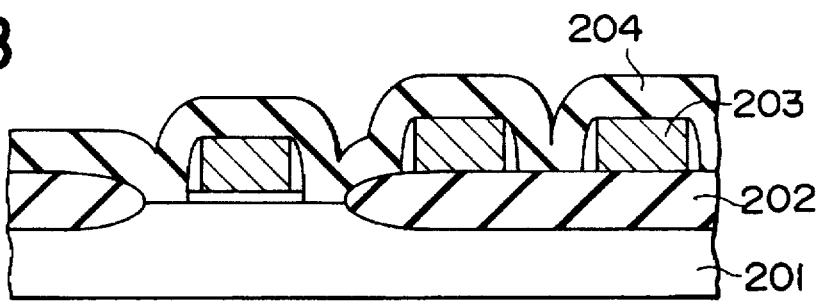

A first oxide film 204 is deposited by a plasma CVD (chemical vapor deposition) method as shown in FIG. 2B. The first oxide film 204 has an uneven or irregular surface and protrusions and recessions or valleys. The first oxide film 204 is partly etched back to widen the recessions.

Figure 2C:
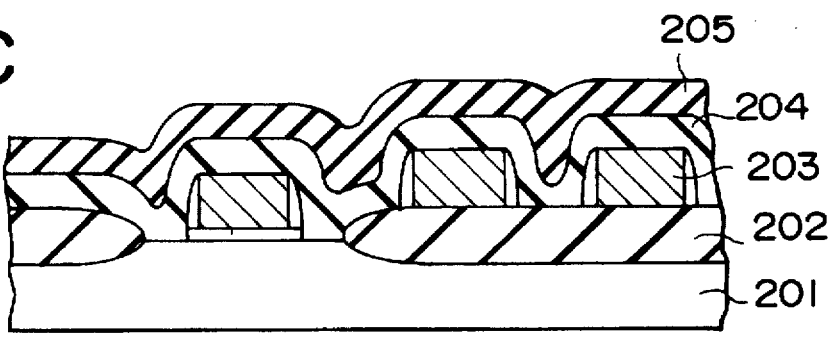
Figure 2D:
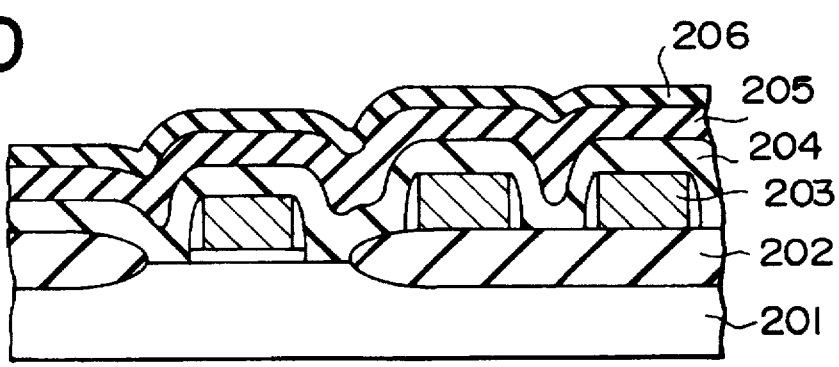

An SOG film 205 is thereafter formed on the first oxide film 204. The widened recessions are embedded by the SOG film 205 as shown in FIG. 2C.

A second oxide film 206 is deposited on the SOG film 205 and has a comparatively flat surface.

In this method, the SOG film 205 is left above the whole surface of the semiconductor substrate 201. When a contact hole is opened through the first oxide film 204, the SOG film 205, and the second oxide film 206, the contact hole is cleaned by an etchant. At this time, the SOG film 205 is etched out faster than the first and the second oxide films 204 and 206 and the contact hole gets out of shape. As a result, another wire is not formed into the contact hole with good quality in a later process. In the worst case, the wire is broken in the contact hole.

Referring to FIGS. 3A through 3G, description will be made about a method according to a first embodiment of this invention. Similar parts are designated by like reference numerals.

Figure 3A:
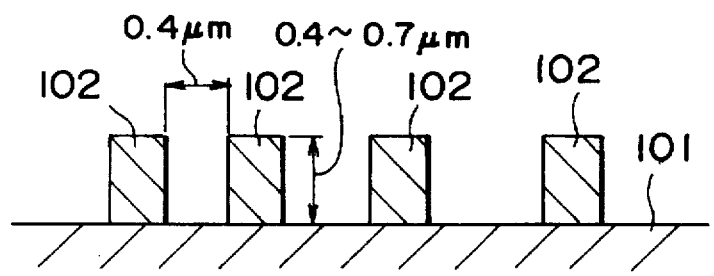
FIGS. 3A through 3G show sectional views for use in describing steps of a method according to a first embodiment of this invention.

In FIG. 3A, the wires 102 are left on the semiconductor substrate 101 by etching for a wiring layer. The wiring layer may be formed by either one of an aluminum film, a tungsten film, and a complex film. The wires 102 have the same height as one another. The height may be, for example, about 0.4–0.7 μm. The wires 102 are placed at predetermined spaces or intervals. For example, a minimum value of the predetermined intervals is 0.4 μm.

Figure 3B:
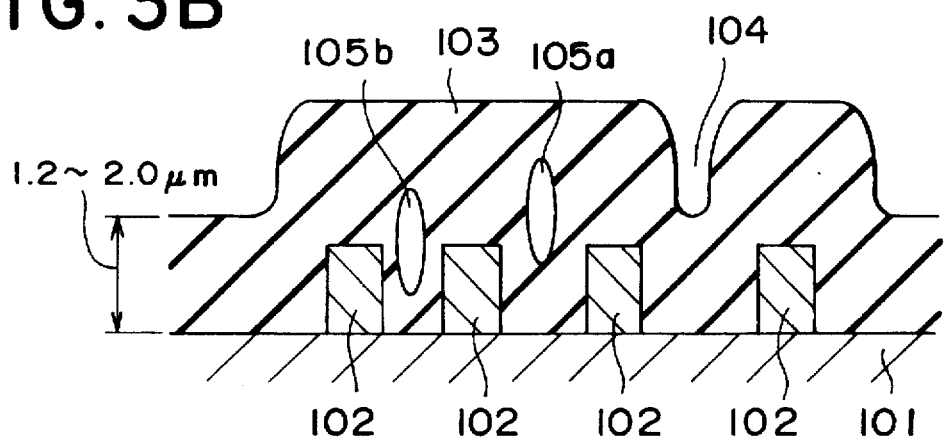

In FIG. 3B, the first insulation film 103 has a thickness of about 1.2–2.0 μm. The first insulation film 103 may be, for example, a P-TEOS (plasma-tetra ethyl oxide silicon) film or $O_3$-TEOS film and include the first and the second undesigned voids 105a and 105b, as shown in FIG. 3B.

Figure 3C:
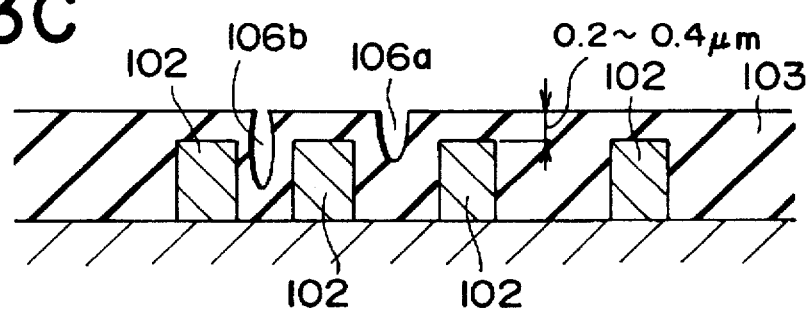

In FIG. 3C, the first insulation film 103 is mechanochemically polished by the use of a polishing solution of colloidal silica and a polishing pad of a foamed polyurethane.

Figure 3D:
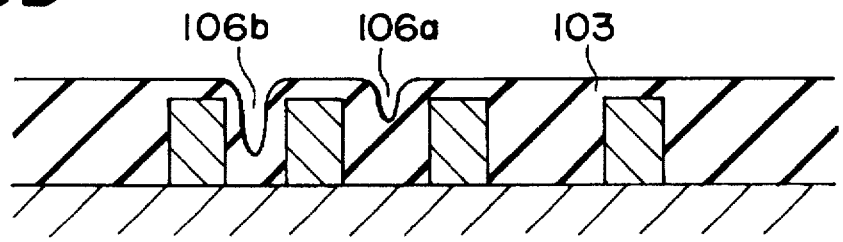
Figure 3E:
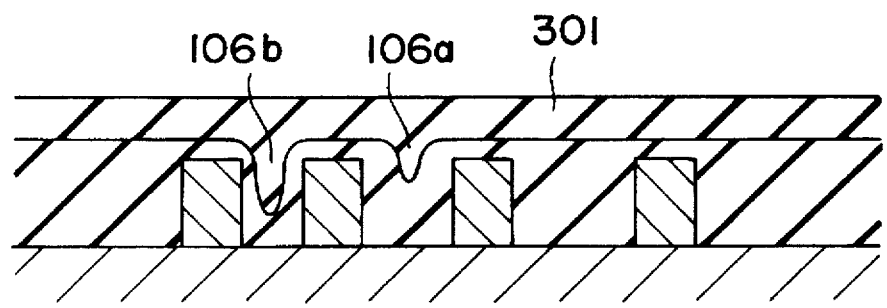

After the polishing process, the first insulation film 103 is partly etched back by a first etching gas which includes a dicarbon hexafluoride ($C_2F_6$) gas and an oxygen ($O_2$) gas. As a result, the first insulation film 103 is etched to a thickness of about 50 nm. In this case, the grooves 106a and 106b are widened at the entrance portions thereof, as shown in FIG. 3D. The entrance portions are wider than the inside portions.

Next, an SOG solution is applied to the surface of the first insulation film 103 while the semiconductor substrate 101 is spun. The SOG solution is introduced into the grooves 106a and 106b and coats the whole surface of the first insulation film 103 and has a thickness which depends on a spin speed of the semiconductor substrate 101. For example, the SOG solution is coated to a thickness of 100 nm. The SOG solution is baked by a temperature of 400° C. at an atmosphere of nitrogen to change the SOG solution into an SOG film 301. These applying and baking processes are repeated, as the case may be, so that the grooves 106a and 106b are completely embedded by the SOG film 301.

After the grooves 106a and 106b are completely embedded by the SOG film 301, the SOG film 301 is etched back for a predetermined time by a second etching gas which includes a hydrocarbon trifluoride ($CHF_3$) gas, a carbon tetrafluoride ($CF_4$) gases, and an argon (Ar) gas. The predetermined time is decided so that the first insulation film 103 is a little etched by the second etching gas and the SOG film 301 is completely removed from the surface of the first insulation film 103 except for a part of the SOG film 301 left within the grooves 106a and 106b. Consequently, the first insulation film 103 becomes thin. For example, the first insulation film 103 loses a thickness of about 50 nm.

Figure 3F:
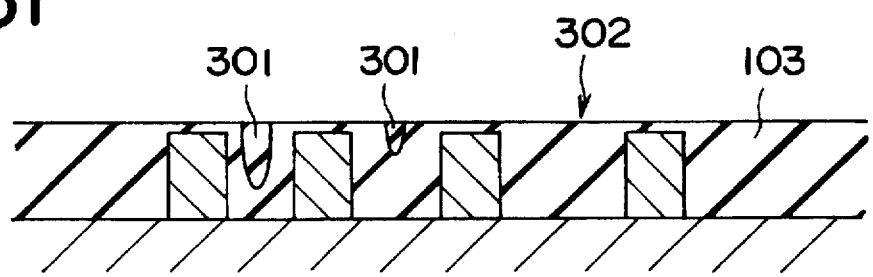
Figure 3G:
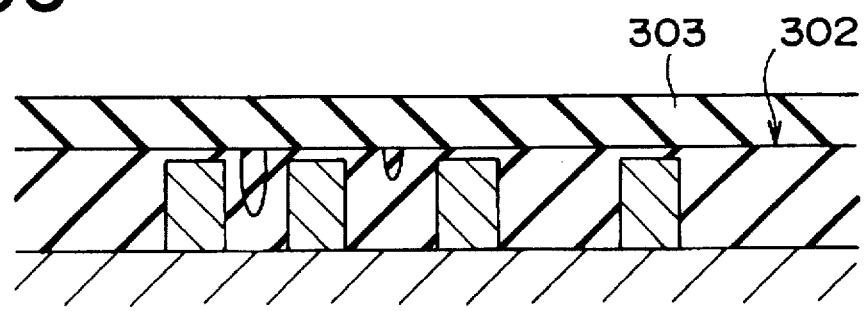

The first insulation film 103 and the SOG film 301 left within the grooves have an flat surface 302 as shown in FIG. 3F because a speed of etching the first insulation film 103 is substantially equal to a speed of etching for the SOG film 301.

Hereafter, a second isolation film 303 is deposited on the flat surface 302 to cover the SOG film 301. The second isolation film 303 is made of, for example, P-TEOS or O₃-TEOS.

Though, in fact, the flat surface 302 has steps between the surface of the first insulation film 103 and the surface of the SOG film 301, the second isolation film 303 can exclude an influence of the steps which are smaller than about 25 nm. Thus, this means that the term of "flat surface" in the instant specification is used for a surface having a irregularity which is smaller than about 25 nm. Therefore, another wiring layer can be formed on the flat surface 302 with good quality. Moreover, a good shaped contact hole can be formed in the insulation layer (103, 301) because the SOG film 301 is left only within the grooves 106a and 106b.

Figure 4A:
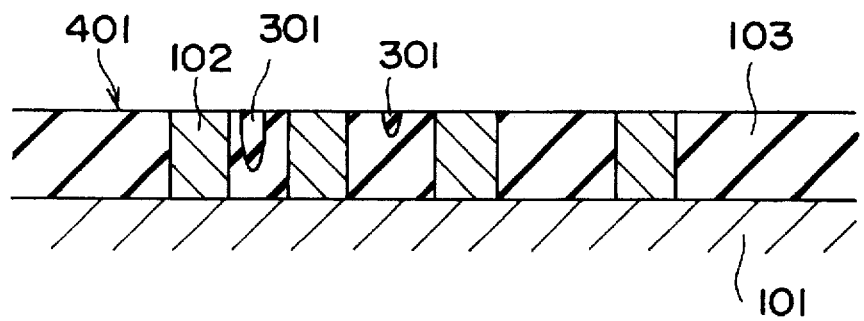
FIGS. 4A and 4B show sectional views for use in describing steps of a method according to a second embodiment of this invention.
Figure 4B:
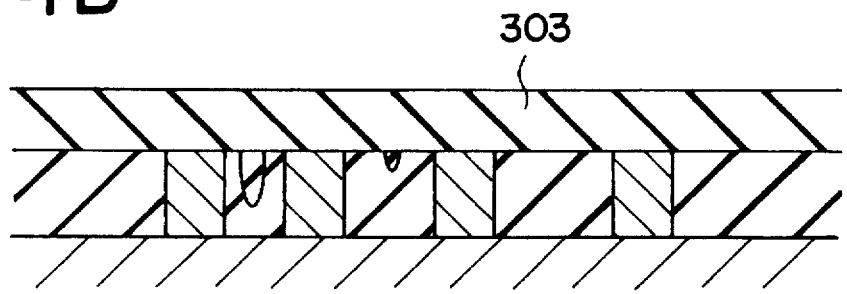

Referring to FIGS. 4A and 4B, description will be made about a method according to a second embodiment of this invention.

In FIG. 4A, the first insulation film 103 is etched together with the SOG film 301 left within the grooves 106a and 106b by the second etching gas until the surfaces of the wires 102 are exposed. A flat surface 401 is formed by the first insulation film 103, the SOG film 301, and the wires 102. In this process, exposure of the wires 102 is detected by an emission analysis to finish the etching simultaneously with the exposure of the wires 102. Accordingly, control of this etching process is more easy than the etching process as mentioned above in conjunction with FIG. 3F.

After the etching process, the second isolation film 303 is deposited on the flat surface 401 to cover the SOG film 301 and the wires 102.

Figure 5:
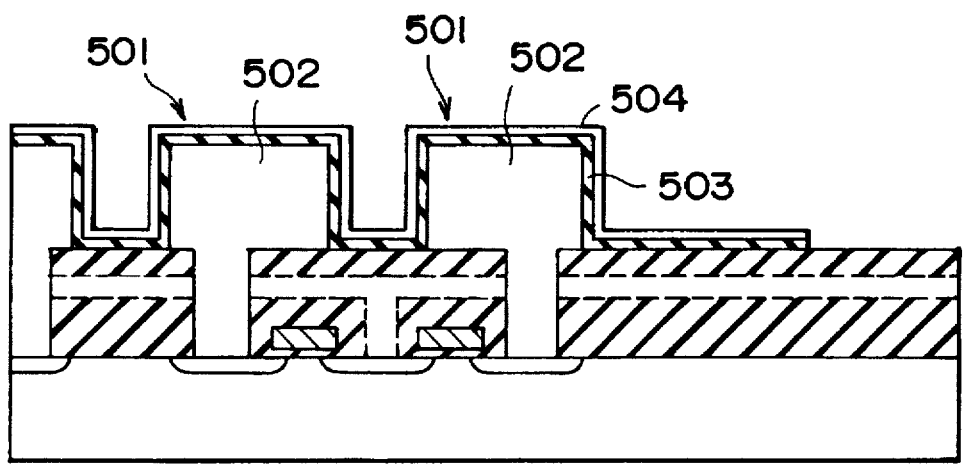
FIG. 5 shows a sectional view of a memory cell which may be covered with an insulation layer formed by the method shown in FIG. 4.

These processes are suitable for a manufacture of a DRAM (Dynamic Random Access Memory) shown in FIG. 5. The DRAM has stack type memory cells 501 each of which involves a capacitor comprising a lower electrode 502, a common capacitive insulation film 503, and a common upper electrode 504. The upper electrode 504 corresponds to the wiring structure, such as the wires 102 of FIGS. 4A and 4B.

The upper electrode 504 is detected by the emission analysis more easily than the wires 102 in an etching process for the first insulation film 103, because the capacitors occupy much area at a surface of a chip of the DRAM and the upper electrode 504 is made of polycrystalline silicon. As a result, the etching process can be finished more precisely than the case of monitoring the wires 102 as shown in FIG. 4A.

Figure 6A:
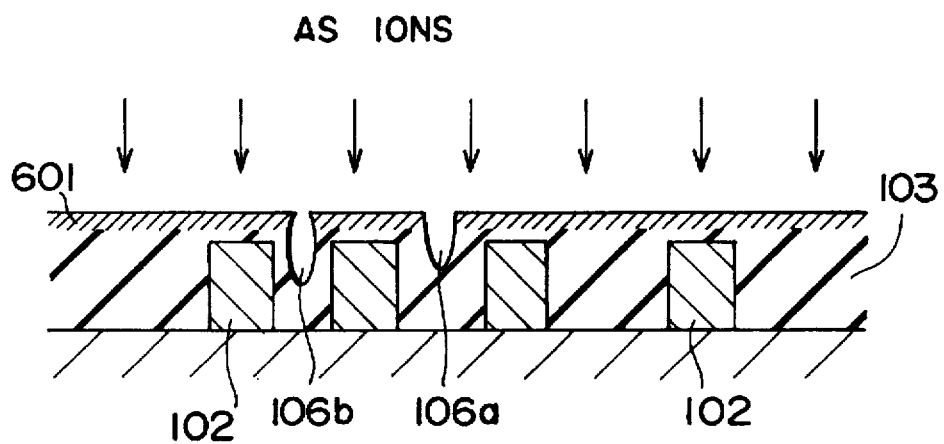
FIGS. 6A and 6B show sectional views for use in describing steps of a method according to a third embodiment of this invention.
Figure 6B:
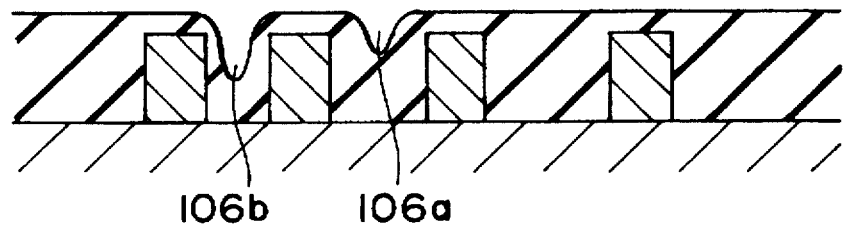

Referring to FIGS. 6A and 6B, description will be made about a method according to a third embodiment of this invention.

In FIG. 6A, after the polishing process for the first insulation film 103, arsenic (As) ions are implanted into the first insulation film 103 by an implantation voltage of about 60 keV to form an implantation layer 601 in the first insulation film 103. The arsenic ions is hard to enter into the grooves 106a and 106b, specially the groove 106b, because the entrance portions of the grooves 106a and 106b are small in width. Accordingly, the implantation layer 601 is scarcely formed at bottoms of the grooves 106a and 106b.

The implantation layer 601 is etched by the first etching gas faster than the first insulation film 103. Therefore, the implantation layer 601 is practically selectively etched by the first etching gas in a short time as shown in FIG. 6B. In addition, the bottoms of the grooves 106a and 106b are hardly etched by the the first etching gas in a short time. In this case, the grooves 106a and 106b are embedded by the SOG film 301 more easily than the grooves 106a and 106b shown in FIG. 3D, because the grooves 106a and 106b have a depth which are shallower than a depth of the groove 106b shown in FIG. 3D.

While this invention has thus far been described in conjunction with a few embodiments thereof, it will be readily possible for those skilled in the art to put this invention into practice in various other manners. For example, a radio frequency spatter etching method may be used for the etching process for the first insulation film 103. In the radio frequency spatter etching method, a projection, such as the entrance portion, is etched much more than plane surface. Consequently, the entrance portions of the grooves 106a and 106b are mainly etched by the the radio frequency spatter etching method and a thickness of the first insulation film 103 hardly becomes thin. It is easy to control the thickness of the first insulation film 103.

What is claimed is:

1. A method of manufacturing an insulation layer having a flat surface on a semiconductor substrate to cover a wiring structure which is formed on said semiconductor substrate and which has a plurality of separated sections having a first thickness, said method comprising the steps of;

depositing a first insulation film on said semiconductor substrate so that said first insulation film has a second thickness which is thicker than said first thickness, said first insulation film including an undesigned void which is formed at a space between said separated sections of said wiring structure;

polishing said first insulation film to expose said void and to change said void into a groove which has an entrance portion, etching said first insulation film to widen said entrance portion;

forming a second insulation film on said first insulation film to be embedded into said groove, and etching said second insulation film at least to said first insulation film to form said substantially flat surface, with a part of the second insulation film left within said groove.

2. A method of manufacturing an insulation layer as claimed in claim 1, said groove having an inside portion, wherein said entrance portion is become wider than said inside portion by the etching step for said first insulation film.

3. A method of manufacturing an insulation layer as claimed in claim 1, wherein the etching step for said second insulation film is continued until a top surface of said wiring structure is exposed.

4. A method of manufacturing an insulation layer as claimed in claim 1, said method further comprising the steps of depositing a third insulation film on said substantially flat surface.

5. A method of manufacturing an insulation layer as claimed in claim 1, said method further comprising the steps of implanting ions into said first insulation film after the polishing step for said first insulation film.

6. A method of manufacturing an insulation layer as claimed in claim 1, wherein said etching step for first insulation film is carried out by a dry etching method.

7. A method of manufacturing an insulation layer as claimed in claim 6, wherein said dry etching method is a sputter etching method utilizing argon gas.

* * * * *